(12) United States Patent
Suguro

(10) Patent No.: US 6,476,454 B2
(45) Date of Patent: Nov. 5, 2002

(54) SEMICONDUCTOR DEVICE AND METHOD OF MANUFACTURING THE SAME

(75) Inventor: Kyoichi Suguro, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/816,171

(22) Filed: Mar. 26, 2001

(65) Prior Publication Data
US 2001/0025999 A1 Oct. 4, 2001

(30) Foreign Application Priority Data

Mar. 27, 2000 (JP) ......................................... 2000-087404

(51) Int. Cl.[7] ......................... H01L 29/76; H01L 29/94; H01L 31/113
(52) U.S. Cl. ...................... 257/410; 257/411; 257/412
(58) Field of Search ................................ 257/388, 411, 257/412, 410, 6, 382, 377, 384, 368, 369

(56) References Cited

U.S. PATENT DOCUMENTS 5,960,270 A * 9/1999 Misra et al. ................ 438/197
6,004,850 A * 12/1999 Lucas et al. ................ 438/301
6,218,311 B1 * 4/2001 McKee et al. .............. 438/719
6,225,168 B1 * 5/2001 Gardner et al. ............. 438/287
6,294,467 B1 * 9/2001 Yokoyama et al. ......... 438/627
6,294,820 B1 * 9/2001 Lucas et al. ................ 257/410
6,300,202 B1 * 10/2001 Hobbs et al. ............... 438/287
6,323,528 B1 * 11/2001 Yamazaki et al. .......... 257/388
6,333,247 B1 * 12/2001 Chan et al. ................. 438/586

FOREIGN PATENT DOCUMENTS

JP          11-224947          8/1999

* cited by examiner

Primary Examiner—John F. Niebling
Assistant Examiner—Walter L. Lindsay, Jr.
(74) Attorney, Agent, or Firm—Finnegan, Henderson, Farabow, Garrett & Dunner, L.L.P.

(57) ABSTRACT

Disclosed is a semiconductor device, comprising a semiconductor substrate, an insulating film and a gate electrode formed on the semiconductor substrate, source-drain regions formed in the semiconductor substrate, and a metal oxide layer formed selectively on the gate electrode. The gate electrode is formed of a first metal, and the metal oxide layer contains a second metal having a reduction amount of a Gibbs standard free energy in forming an oxide that is larger than that of the first metal.

18 Claims, 7 Drawing Sheets

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2000-087404, filed Mar. 27, 2000, the entire contents of which are incorporated herein by reference.

BACKGROUND OF THE INVENTION

The present invention relates to a semiconductor device and a method of manufacturing the same, particularly, to a transistor in which the gate electrode is formed by a damascene gate process, i.e., a burying method, and a method of manufacturing the same.

In recent years, a large scale integrated circuit (LSI) in which a large number of transistors, resistors, etc. are connected to form an electric circuit and are integrated on an single chip is used in an important portion of a computer or a communication equipment. Therefore, the performance of the entire equipment is deeply related to the performance of the LSI body. The performance of the LSI body can be improved by increasing the degree of integration, i.e., by miniaturizing the element. When it comes to, for example, a MOS field effect transistor (MOS transistor), the miniaturization of the element can be achieved by decreasing the gate length and by decreasing the thickness of the source-drain regions.

A low acceleration ion implantation method is widely employed as a method of forming shallow source-drain regions. Source-drain regions having a depth not larger than 0.1 μm can be formed by this method. However, the impurity diffusion layer formed by the low acceleration ion implantation method has a high sheet resistance of at least $100\Omega/cm^2$, making it difficult to achieve a high speed operation by the miniaturization. Such being the situation, a salicide is employed for decreasing the resistance of the source-drain-gate in a device requiring a high speed operation such as a LOGIC-LSI. The term "salicide" noted above denotes that a silicide film is formed by self-alignment on the surfaces of the source-drain diffusion layers and the gate electrode (n+ or p+ polycrystalline silicon).

In the case of employing a dual gate, in which an n+ polycrystalline silicon (polysilicon) and a p+ polysilicon are used as the underlying layers of the silicide layer within the same layer, the salicide structure permits not only decreasing the resistance of the gate electrode but also simplifying the process. The particular effect can be obtained because the employment of the salicide structure makes it possible to achieve doping of an impurity into the gate polysilicon in the step of an impurity doping in the source-drain regions. On the other hand, in the case of employing a W polycide as a gate electrode, it is necessary to perform at different timings the step of dividing the polysilicon in the bottom portion of the gate electrode into an n+doping and a p+doping and the step of dividing the source-drain into an $n_+$doping and a $p_+$doping. It follows that additional steps are required including two times of the lithography step, two times of the ion implantation step, and two times of the resist removing step.

On the other hand, SAC (self-aligned contact) is absolutely required in the device requiring the design of a high density element such as a memory LSI. In the SAC structure, the gate electrode surface must not be exposed to the outside in the step of forming a contact hole in an insulating film on the source or drain region. Therefore, it is necessary to form a silicon nitride layer, which acts as a stopper film in the step of subjecting a silicon oxide film to a reactive ion etching (RIE), on the gate electrode surface. It follows that, in the case of a memory LSI, it is impossible to apply the salicide used in the LOGIC-LSI to the gate electrode.

It was customary in the past to use a polysilicon layer doped with an impurity in the memory LSI. Also, in view of the necessity for decreasing the resistance, employed is a W polycide structure in which a W silicide is laminated on the polysilicon layer. Where the resistance is further decreased, employed is a polymetal structure in which an ultra thin barrier metal layer is formed on the polysilicon layer and a W film is laminated on the barrier metal layer. The polymetal structure has a resistivity lower than that of the structure prepared by laminating a silicide film on the polysilicon layer, making it possible to achieve a desired sheet resistance with a smaller film thickness. However, a dual gate is required in the LOGIC-LSI. Therefore, it is necessary to perform an impurity doping to the polysilicon layer in the gate and to the source-drain regions at different timings, leading to a marked increase in the manufacturing cost.

In an LSI in which a LOGIC and a DRAM are mounted together, if a salicide is attached to the source-drain regions in the DRAM, a pn junction leak current is increased in the memory cell portion, leading to a lowered retaining characteristics. Also, a W polycide is used in the gate electrode because of the particular construction of the SAC structure described above. On the other hand, in the LOGIC, it is necessary to lower the threshold voltage of the MOSFET because current is allowed to flow as much as possible under a low voltage. Such being the situation, the polysilicon of the polycide is doped with P or As in the n-channel MOSFET to use the polysilicon as a $n_+$-silicon layer and is doped with $BF_3$ in the p-channel MOSFET to use the polysilicon as a $p_+$-silicon layer.

Incidentally, DRAM requires a large heat budget after formation of the gate electrode. Therefore, in the case of using the gate electrode structure in which a polysilicon layer forms the lowermost layer, two problems given below are generated in the heating step after formation of the gate electrode.

First of all, impurity atoms such as As atoms and P atoms are outwardly diffused from the polysilicon layer into the W silicide layer, leading to reduction in the impurity concentration in the polysilicon layer. As a result, a depletion layer is expanded within the gate electrode in the step of applying voltage so as to deplete the gate. It follows that the gate capacitance is rendered smaller than the actual value determined by the gate insulating film.

A second problem is that boron atoms within the polysilicon layer are diffused through the gate insulating film so as to reach the silicon substrate. As a result, the distribution in the impurity concentration in the channel region is changed so as to change the threshold voltage of the MOSFET. The inward diffusion of the boron atoms (B) is promoted in the case where F or hydrogen are present together with B. Incidentally, where nitrogen is added to the gate insulating film, a B—N bond is formed at the interface between the polysilicon layer and the gate insulating film because the B—N bond is strong, with the result that the inward diffusion of B is suppressed.

The two problems described above can be summarized as follows:

(1) A gate electrode is required independently for each of the LOGIC-LSI and the memory LSI, making it impossible to use a common gate electrode; and (2) The gate depletion and the inward diffusion of B are generated in the case of employing the polycide or polymetal structure.

Various measures are being proposed for solving the problems given above. For example, proposed is a so-called "metal gate" in which a metal material, not a semiconductor material, is formed directly on the gate insulating film. It is certainly possible to solve the problems derived from the inactivation of the impurities and the impurity diffusion by using the metal gate. However, it is difficult to achieve a precise gate processing in the case of the metal gate.

A method of using a dummy gate is also known to the art. In this method, a dummy gate is formed first, followed by forming source-drain regions and an interlayer insulating film. Then, the surface of the dummy gate is exposed to the outside and the dummy gate is removed, followed by forming a new metal gate film.

Incidentally, the damascene gate process is a process that facilitates the application of the metal gate and an insulating film having a high dielectric constant. However, where the clearance between the contact and the wiring is small and, thus, SAC is required like a high density memory, a problem is generated as follows. Specifically, where, for example, a W/TiN laminate structure is used as a gate electrode, the surface of the W layer is exposed to the outside. In order to avoid the exposure, it is necessary to remove a portion of a surface layer of the W layer, and then, to form a film having an etching rate lower than that of an oxide film. For example, it is necessary to form a silicon nitride film. However, if the thickness of the gate electrode is not larger than 100 nm, it is difficult to control the recess etching amount of the W layer, giving rise to an unevenness of about ±30 nm. As a result, the sheet resistance of the gate is rendered markedly uneven such that the sheet resistance falls within a range of between 1 and 10 $\Omega/cm^2$. In addition, the number of process steps is increased to include the steps of recess etching/wet processing/CVD of silicon nitride film/CMP/wet processing.

The method by the conventional technology will now be described with reference to FIGS. 1A to 1D. It should be noted that, in FIGS. 1A to 1D, the portions of the element isolating insulating film, source-drain regions, a well, a channel, and a gate side wall spacer are omitted from the actual manufacturing process of a transistor.

In the first step, an insulating film 72 having a thickness of 70 to 200 nm is formed on a silicon semiconductor substrate 71, followed by flattening the surface of the insulating film 72, as shown in FIG. 1A. Further, a groove for burying a gate electrode is formed in the insulating film 72, and a gate insulating film 73 consisting of a silicon oxide film, a silicon nitride film or a silicon oxynitride film (SiON) is formed in the bottom portion of the groove. Then, a barrier metal film 74 such as a TiN film and a W film 75 having a low resistivity are formed on the entire surface, followed by removing the undesired metal films other than those inside the groove by CMP or MP.

In the next step, the surface region of the W film 75 is removed in a thickness of about 20 nm to 100 nm by RIE or a wet etching, followed by removing the remaining barrier metal film 74 by a wet etching such that the upper surface of the barrier metal layer 74 is flush with the upper surface of the W layer 75, as shown in FIG. 1B. Further, a silicon nitride film 76 is deposited on the entire surface in a thickness of 30 nm to 150 nm by an LP-CVD method or a P-CVD method as shown in FIG. 1C, followed by removing the undesired portion of the silicon nitride film 76 by a CMP method or an MP method, as shown in FIG. 1D.

In the case of employing the method described above, additional steps of recess etching is performed two times, an additional CVD step for forming a silicon nitride film is performed, and an additional step of CMP is also performed, leading to an increase in the number of process steps and to an increased RPT (raw process time). It follows that the manufacturing cost of the semiconductor device is increased.

In order to avoid the increase in the manufacturing cost, a method of using an Al electrode is known to the art. However, since Al has a low melting point of 660° C., it is necessary to carry out the heat treating step after formation of the Al gate at temperatures not higher than 600° C. It follows that, in the case of selecting Al as the metal, the Al gate is incapable of withstanding the heat treating step of 600° to 650° C. required in the step of forming a PZT or BST capacitor after the gate formation.

BRIEF SUMMARY OF THE INVENTION

An object of the present invention is to provide a semiconductor device with a high degree of integration, comprising a gate electrode having a high resistance to heat and having a small distance between the gate of a metal gate transistor and the source-drain contact.

Another object of the present invention is to provide a method of manufacturing a semiconductor device with a high degree of integration, comprising a gate electrode having a high resistance to heat and having a small distance between the gate of a metal gate transistor and the source-drain contact, the method making it possible to manufacture the particular semiconductor device by a simplified manufacturing process without increasing RPT.

According to a first aspect of the present invention, there is provided a semiconductor device, comprising:

a semiconductor substrate;

an insulating film formed on the semiconductor substrate and a gate electrode formed on the insulating film;

source-drain regions formed in the semiconductor substrate; and a metal oxide layer formed selectively on the gate electrode;

wherein the gate electrode is formed of a first metal, and the metal oxide layer contains a second metal having a reduction amount in a Gibbs standard free energy in forming an oxide larger than that of the first metal.

According to a second aspect of the present invention, there is provided a method of manufacturing a semiconductor device, comprising the steps of:

forming a gate electrode containing a first metal on a semiconductor substrate with an insulating film interposed therebetween;

forming source-drain regions in the semiconductor substrate; and selectively forming a metal oxide layer containing a second metal on the gate electrode;

wherein the second metal has a reduction amount in a Gibbs standard free energy in forming an oxide larger than that of the first metal.

In the present invention, it is desirable for the first metal to be at least one metal selected from the group consisting of W, Mo, Ru, Ag, and Cu.

Also, it is desirable for the second metal to be at least one metal selected from the group consisting of Al, Ti, Zr, Hf, Nb, Ta, Ba, Sr, Y and La series elements. The La series elements include La, Ce, Pr, Nd, Pm, Sm, Eu, Gd, Tb, Dy, Ho, Er, Tm, Yb and Lu.

In the semiconductor device of the present invention, it is desirable for the thickness of the metal oxide layer to be 1 to 50 nm.

Further, it is desirable for the semiconductor device of the present invention to comprise an interlayer insulating film consisting of a silicon oxide film, and it is also desirable for the second metal to have a reduction amount in a Gibbs standard free energy in forming an oxide larger than that of the material forming the interlayer insulating film.

It is possible for the semiconductor device of the present invention to comprise a layer of a third metal or a compound of the third metal formed in the bottom surface of the gate electrode. In this case, it is desirable for the third metal not to be alloyed or not to form a compound with the first metal. Also, the crystal grain diameter of the third metal should desirably be smaller than that of the first metal.

It is also possible for the semiconductor device of the present invention to comprise a layer of a third metal or a compound of the third metal formed on the bottom surface and the side surface of the gate electrode. In this case, it is desirable for the third metal not to be alloyed or not to form a compound with the first metal. Also, the crystal grain diameter of the third metal should desirably be smaller than that of the first metal.

In the method of the present invention for manufacturing a semiconductor device, it is desirable for the metal oxide layer containing the second metal to be formed by the step of implanting ions of the second metal into the gate electrode so as to form an ion implantation layer and the step of selectively oxidizing the ion implantation layer.

Alternatively, it is desirable for the metal oxide layer containing the second metal to be formed by the step of forming a metal film containing the second metal on the gate electrode containing the first metal, the step of forming an alloy film containing the first metal and the second metal on the gate electrode, and the step of selectively oxidizing the alloy film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A method of the present invention for manufacturing a semiconductor device will now be described in detail with reference to the accompanying drawings.

First Embodiment

A first embodiment of the present invention will now be described with reference to FIGS. 2A to 2C. In these drawings, the portions of the element isolating insulating film, source-drain regions, a well, a channel and a gate side wall spacer are omitted from the actual manufacturing method of a transistor.

Figure 1A:
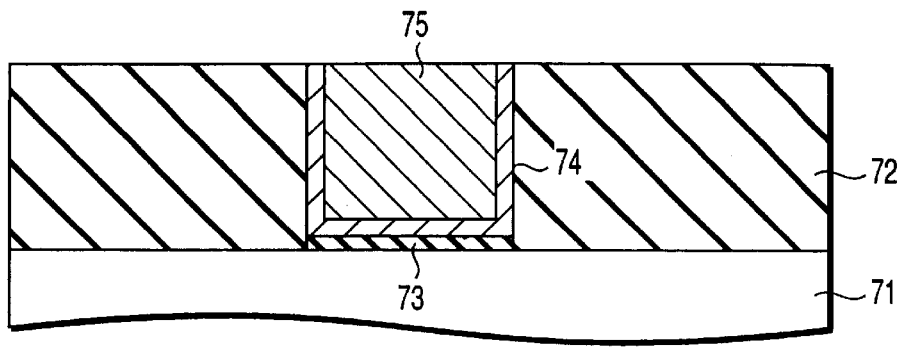
FIGS. 1A to 1D are cross sectional views collectively showing a conventional method of manufacturing a semiconductor device.
Figure 1B:
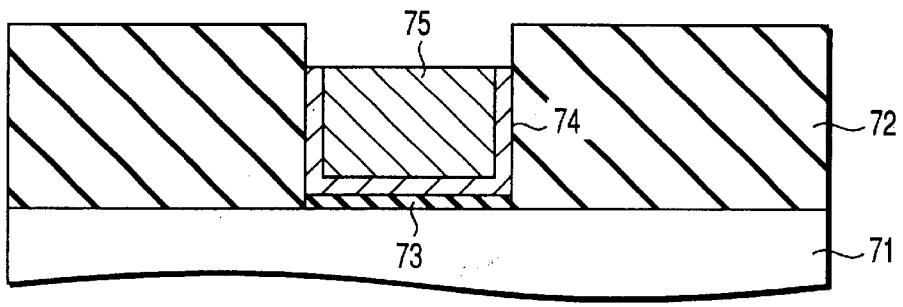
Figure 1C:
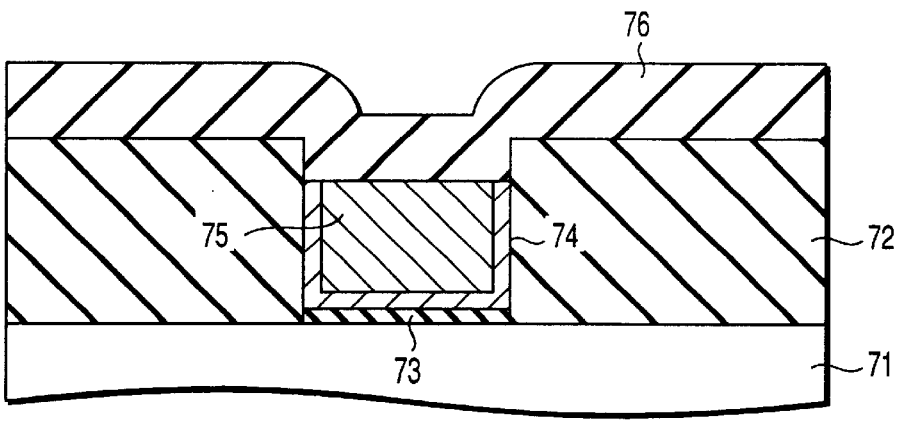
Figure 1D:
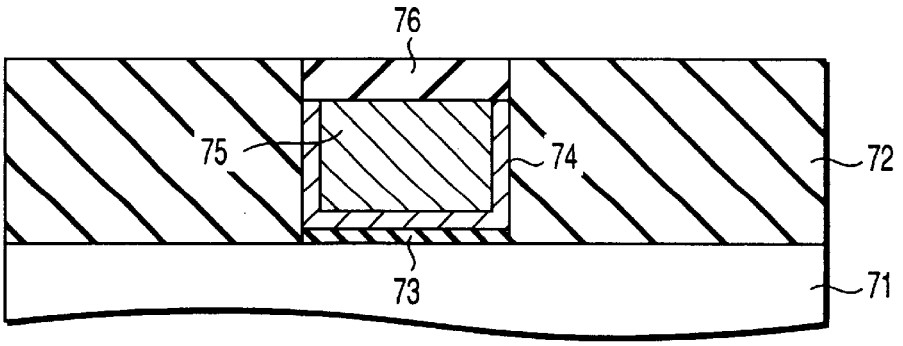
Figure 2A:
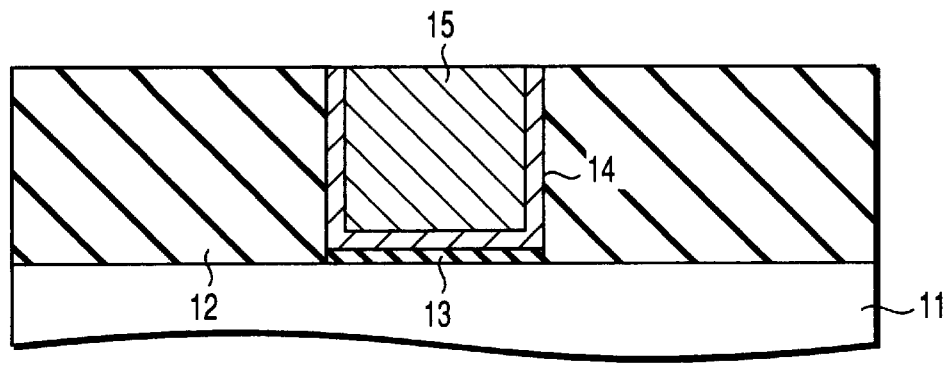
FIGS. 2A to 2C are cross sectional views collectively showing as an example of a method of manufacturing a semiconductor device of the present invention.

First of all, the structure shown in FIG. 2A is prepared as follows. Specifically, an element isolating insulating film, source-drain regions, a well, a channel, a dummy gate, a gate side wall spacer, etc. are formed on a semiconductor substrate 11, followed by forming an insulating film 12 in a thickness of 70 to 200 nm and, then, the surface of the insulating film 12 is flattened. It is possible for the insulating film 12 to be formed of, for example, a silicon oxide film, a $SiO_xC_y$ film or a $SiO_xN_y$ film. Further, a groove for burying a gate electrode is formed in the insulating film 12 by a dummy gate removing method or the like in a depth of 70 to 200 nm.

A gate insulating film 13 consisting of a silicon oxide film, a silicon nitride film or a silicon oxynitride film (SiON) is formed in the bottom portion of the groove. It is possible for the gate insulating film 13 to be formed of a material having a high dielectric constant such as $Ta_2O_5$, $TiO_2$, $HfO_2$, $ZrO_2$, $CeO_2$ or $Y_2O_3$. Further, a barrier metal film 14 and a gate electrode 15 containing a first metal are successively deposited on the entire surface within the groove. It is possible for the barrier metal film 14 to be formed of, for example, a TiN film, a TaN film, a $MoN_X$ film, a $WN_X$ film, a ZrN film, a HfN film or a NbN film. On the other hand, the gate electrode 15 is formed of a material having a low resistivity, which is selected from the group consisting of W, Mo, Ru, Ag and Cu. The thickness of the gate electrode 15 should be about 20 to 100 nm.

Finally, the undesired metal films other than those inside the groove are removed by, for example, a chemical mechanical polishing (CMP) method or a mechanical polishing (MP) method so as to obtain the structure shown in FIG. 2A.

Figure 2B:
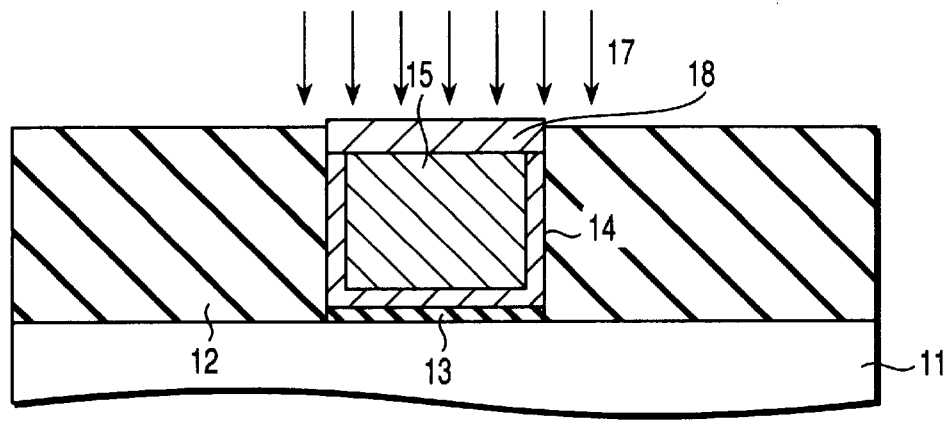

In the next step, ions 17 of a second metal are implanted into a surface region of the gate electrode 15 so as to form an ion implantation layer 18, as shown in FIG. 2B. The second metal is easier to form an oxide than the first metal constituting the gate electrode 15 and consists of at least one element selected from the group consisting of Al, Ti, Zr, Hf, Nb, Ta, Y, Ba, Sr and La series elements. The combination of the first metal and the second metal can be selected appropriately. In performing the ion implantation, the accelerating energy is set such that the peak in the implanted ion concentration is formed within 30 nm from the surface of the gate electrode 15, and the ion implantation is performed at a dose of at least $5\times10^{15} cm^{-2}$.

The second metal used in the present invention can be said to have a reduction amount in the Gibbs standard free energy in forming an oxide smaller than that of the first metal forming the gate electrode 15. Further, in the case of forming an interlayer insulating film made of $SiO_2$, the interlayer insulating film has a reduction amount in the Gibbs standard free energy in forming an oxide that is intermediate between the value for the first metal and the value for the second metal.

Figure 2C:
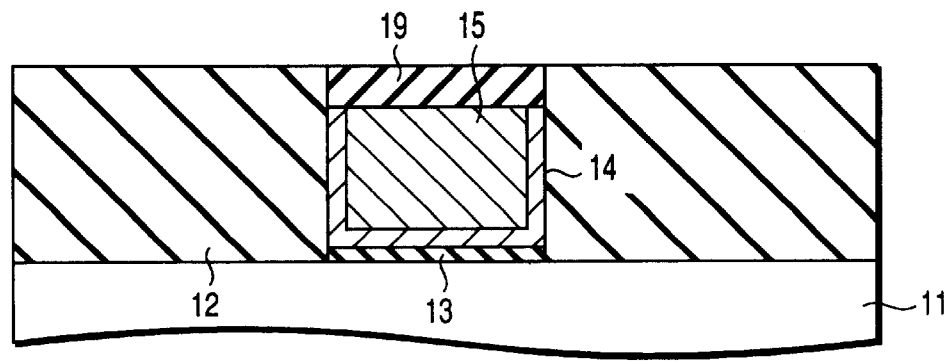

Then, the second metal introduced into the ion implantation layer 18 is selectively oxidized so as to form a metal oxide layer 19 as shown in FIG. 2C. The second metal can be selectively oxidized by using a $H_2O/H_2$ or $CO_2/CO$ gas system having a predetermined partial pressure ratio. In this case, the partial pressure of the gas used can be determined depending on the kinds, etc. of the first and second metals. For example, where W is used as the first metal and any of Al, Ti and Ta is used as the second metal that is introduced into the surface region of the gate electrode 15 by means of ion implantation, it is desirable for the ratio of $H_2O/H_2$ at about 0.1 or less and for the ratio of $CO_2/CO$ at about 0.01 or less. Also, where Cu is used as the first metal and Al, Ti, etc. is introduced as the second metal, it is desirable for the ratio of $H_2O/H_2$ at about $10^5$ or less and for the ratio of $CO_2/CO$ at about $2 \times 10^5$ or less.

Further, where Ag is used as the first metal and Al, Ti, Zr or Hf is introduced as the second metal, it is desirable for the ratio of $H_2O/H_2$ at about $10^6$ or less and for the ratio of $CO_2/CO$ at about $10^6$ or less.

The metal oxide layer 19 formed by the selective oxidation of the second metal can be called a cap layer. It is desirable for the cap layer to have a thickness falling within a range of between 1 nm and 50 nm. Where the thickness of the cap layer is smaller than 1 nm, the cap layer tends to be removed in the step of etching the silicon oxide film described previously, with the result the effect produced by the cap layer is rendered insufficient. On the other hand, where the thickness of the cap layer exceeds 50 nm, the volume of the insulating film having a large dielectric constant is increased, with the result that the capacitance between adjacent layers and the capacitance between adjacent wiring layers tend to be increased. It is more desirable for the thickness of the metal oxide layer 19 to fall within a range of between 5 nm and 30 nm.

A $SiO_2$ film was formed as an interlayer insulating film (not shown) on the resultant structure, followed by forming a contact hole in the $SiO_2$ film so as to evaluate the stopper performance when the $SiO_2$ is etched. It has been found that, where an $Al_2O_3$ film was formed in a thickness of about 10 nm as the metal oxide film 19, the etching selectivity ratio relative to the $SiO_2$ film has been found to be not lower than 50. Also, where a film of $TiO_2$, $ZrO_2$, $HfO_2$, $Nb_2O_5$, $Ta_2O_5$, $Y_2O_3$, or CeO was formed in a thickness of about 10 nm, the etching selectivity ratio relative to the $SiO_2$ film was found to be not lower than 30.

Second Embodiment

A second embodiment of the present invention will now be described with reference to FIGS. 3A to 3D. In these drawings, the portions of the element isolating insulating film, source-drain regions, a well, a channel and a gate side wall spacer are omitted from the actual manufacturing method of a transistor.

Figure 3A:
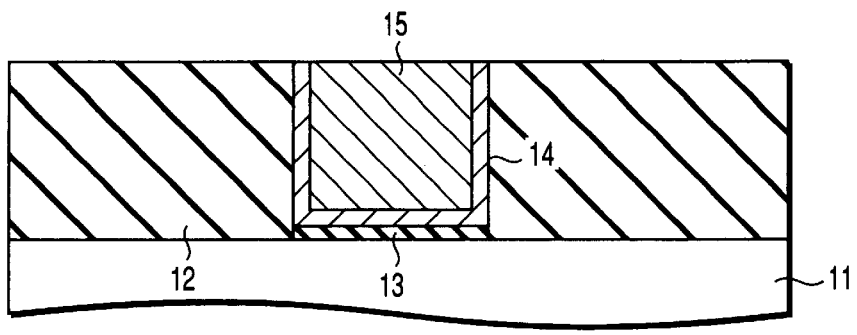
FIGS. 3A to 3D are cross sectional views collectively showing as another example of a method of manufacturing a semiconductor device of the present invention.

First of all, the structure as shown in FIG. 3A is prepared. The particular structure can be obtained by the method described previously in conjunction with FIG. 2A.

Figure 3B:
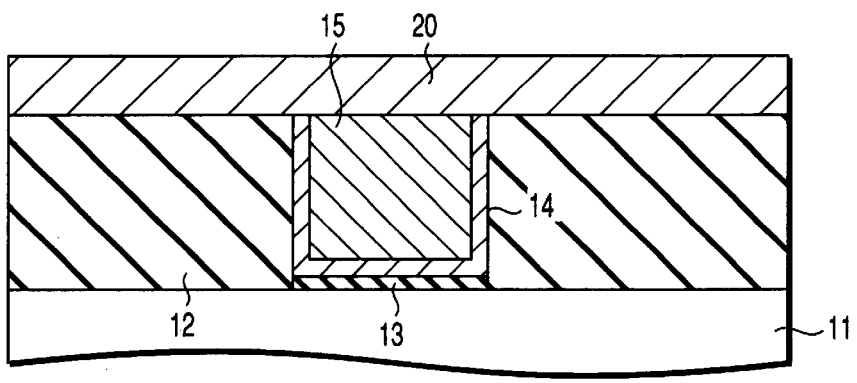

In the next step, a metal film 20 containing a second metal is formed to cover the entire surfaces of the gate electrode 15 and the insulating film 12, as shown in FIG. 3B. The second metal is easier to form an oxide than the first metal forming the gate electrode 15 and consists of at least one element selected from the group consisting of Al, Ti, Zr, Hf, Nb, Ta, Y, Ba, Sr and La series elements. It is desirable for the second metal film 20 to have a thickness of 10 nm to 100 nm. Where the thickness of the second metal film is less than 10 nm, a uniform reaction with the underlying first metal layer is unlikely to take place. On the other hand, if the thickness exceeds 100 nm, the reaction amount with the first metal is increased, with the result that the resistivity of the first metal layer tends to be increased by at least 10%.

Figure 3C:
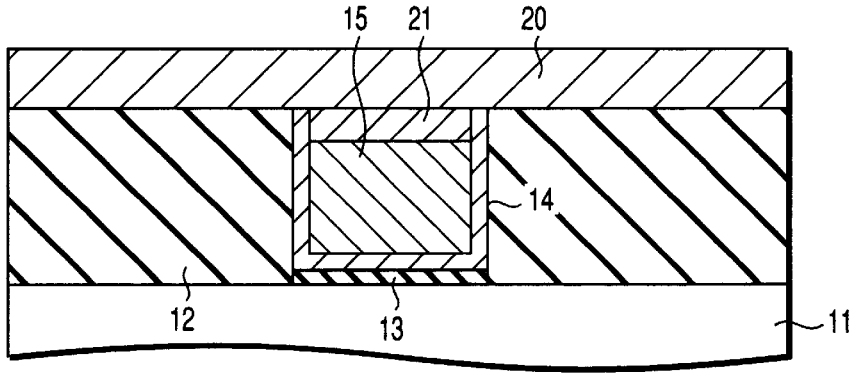

In the next step, an alloy film 21 between the first metal and the second metal is formed in the interface between the gate electrode 15 and the metal film 20, as shown in FIG. 3C. The alloy film 21 can be formed by, for example, a heating treatment, a heater heating, an infrared ray heating, an ultraviolet ray heating and a combination thereof. It is desirable for the alloy film 21 to have a thickness of 1 to 50 nm. If the thickness is less than 1 nm, the alloy film 21 tends to be removed in the step of etching the silicon oxide film. On the other hand, if the thickness exceeds 50 nm, the volume of the insulating film having a large dielectric constant is increased, with the result that the capacitance between adjacent layers and the capacitance between adjacent wiring layers tend to be increased.

Figure 3D:
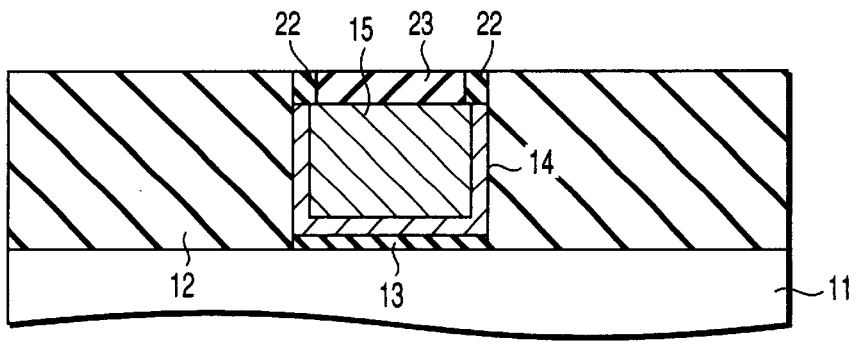

Further, the metal film 20 is removed by, for example, a wet etching so as to expose the alloy film 21 to the outside, followed by selectively oxidizing the second metal contained in the alloy film 21 so as to form a metal oxide layer 23, as shown in FIG. 3D. The selective oxidation of the second metal is carried out by using a $H_2O/H_2$ gas system or a $CO_2/CO$ gas system having a predetermined partial pressure ratio under the conditions similar to those employed in the first embodiment described previously.

By the reasons described previously, it is desirable for the thickness of the metal oxide layer 23 to fall within a range of between 1 nm and 50 nm, preferably between 5 nm and 30 nm. Also, a metal oxide film 22 having a similar thickness is also formed on the barrier metal film 14, as shown in FIG. 3D.

A silicon oxide film was formed as an interlayer insulating film (not shown) on the resultant structure, and a contact hole (not shown) was formed in the interlayer insulating film so as to evaluate the stopper performance when the silicon oxide ($SiO_2$) film was etched. It has been confirmed that, where an $Al_2O_3$ film having a thickness of about 20 nm was formed as the metal oxide layer 23, it was possible to obtain an etching selectivity ratio of 50 or more relative to the $SiO_2$ film. Also, in the case of forming a film of $TiO_2$, $ZrO_2$, $HfO_2$, $Nb_2O_5$, $Ta_2O_5$, $Y_2O_3$, or CeO in a thickness of about 20 nm, it has been confirmed that it was possible to obtain an etching selectivity ratio of 30 or more relative to the $SiO_2$ film.

Third Embodiment

A third embodiment of the present invention will now be described with reference to FIGS. 4A and 4B. In these drawings, the portions of the element isolating insulating film, source-drain regions, a well, a channel and a gate side wall spacer are omitted from the actual manufacturing method of a transistor.

Figure 4A:
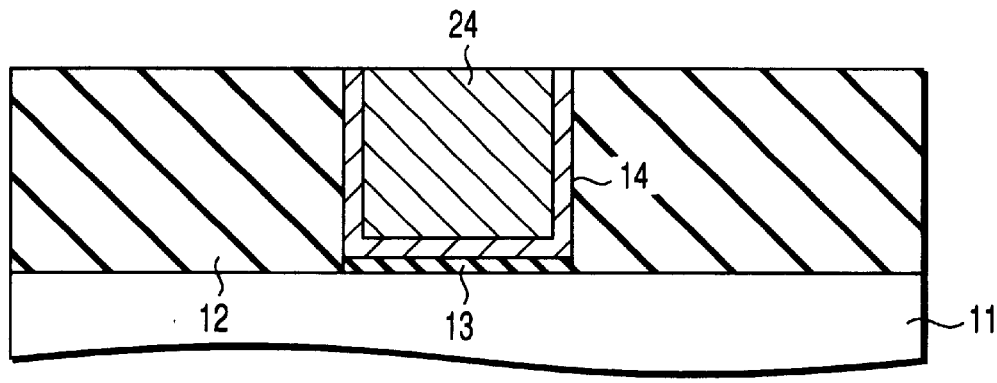
FIGS. 4A and 4B are cross sectional views collectively showing as another example of a method of manufacturing a semiconductor device of the present invention.

First of all, the structure as shown in FIG. 4A is prepared. The particular structure can be obtained basically by the method described previously in conjunction with FIG. 2A, except that a gate electrode 24 shown in FIG. 4A is formed of a material containing both the first metal and the second metal described previously. In this case, it is desirable for the content of the second metal to be about 1% to 10% of the content of the first metal. Where the second metal content is less than 1% of the first metal content, it is difficult to obtain an oxide layer having a sufficient thickness in the subsequent step of forming an oxide layer of the second metal. On the other hand, if the second metal content exceeds 10%, the resistivity of the first metal layer tends to be increased by 10% or more.

For example, it is possible to form the gate electrode 24 by depositing a W film containing about 8% of Al on the barrier metal film 14 by, for example, a CVD method, a sputtering method or a vapor deposition method.

Figure 4B:
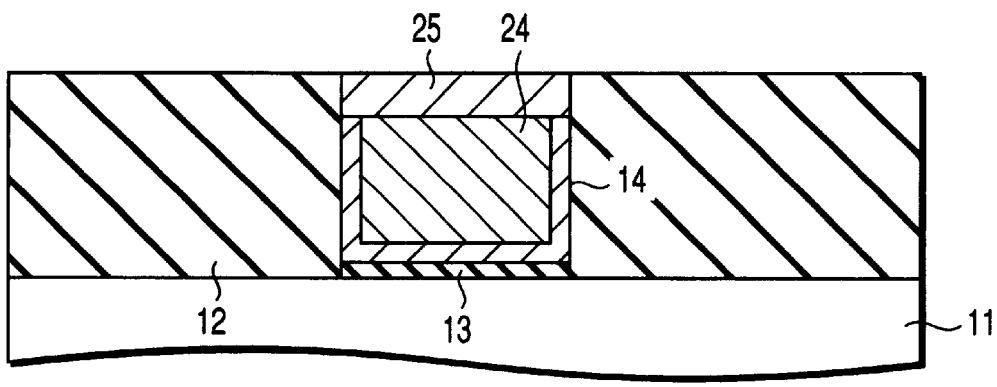

In the next step, the second metal contained in the gate electrode 24 is selectively oxidized so as to form a metal oxide layer 25 in an upper portion of the gate electrode 24, as shown in FIG. 4B. The selective oxidation of the second metal is carried out by using a $H_2O/H_2$ gas system or a $CO_2/CO$ gas system having a predetermined partial pressure ratio under the conditions similar to those employed in the first embodiment described previously.

By the reasons described previously, it is desirable for the thickness of the metal oxide layer 25 to fall within a range of between 1 nm and 50 nm, preferably between 5 nm and 30 nm.

A silicon oxide film was formed as an interlayer insulating film (not shown) on the resultant structure, and a contact hole (not shown) was formed in the interlayer insulating film so as to evaluate the stopper performance when the silicon oxide ($SiO_2$) film was etched. It has been confirmed that, where an $Al_2O_3$ film having a thickness of about 20 nm was formed as the metal oxide layer 25, it was possible to obtain an etching selectivity ratio of 50 or more relative to the $SiO_2$ film. Also, in the case of forming a film of $TiO_2$, $ZrO_2$, $HfO_2$, $Nb_2O_5$, $Ta_2O_5$, $Y_2O_3$, or CeO in a thickness of about 20 nm, it has been confirmed that it was possible to obtain an etching selectivity ratio of 30 or more relative to the $SiO_2$ film.

It is possible for the method of the third embodiment described above to bring about inconveniences such as an increase in the resistivity of the first metal layer, leading to an increased resistivity of the gate electrode. In order to avoid such an inconvenience, it is desirable to employ the method described previously in conjunction with the first embodiment and the second embodiment.

Fourth Embodiment

A method of manufacturing a transistor as a fourth embodiment of the present invention will now be described with reference to FIGS. 5A to 5C, 6A to 6C, 7A and 7B.

Figure 5A:
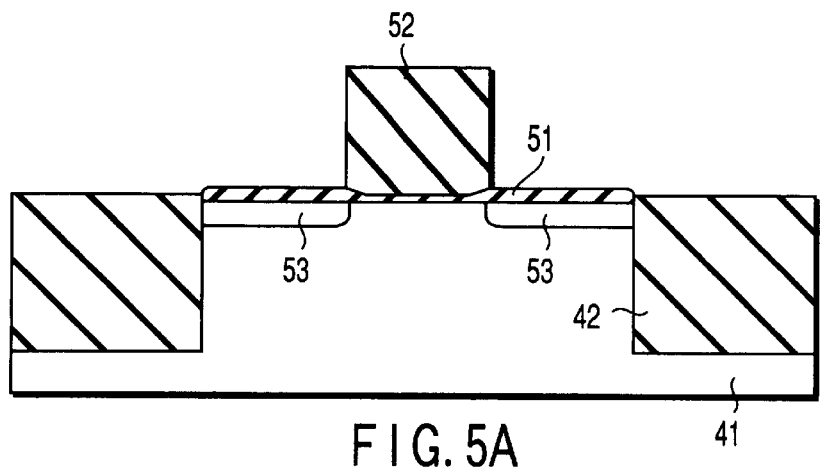
FIGS. 5A to 5C are cross sectional views collectively showing as another example of a method of manufacturing a semiconductor device of the present invention.

First of all, the structure as shown in FIG. 5A is prepared. The particular structure can be obtained by the procedures described in the following. In the first step, a groove is formed in a surface region of a silicon semiconductor substrate 41 by a dry etching method, followed by forming an insulating film inside the groove by deposition or coating. It is possible for the insulating film to be formed of a silicon oxide film or a SiNO film having a thermal expansion coefficient of about 3 ppm/K, which is close to that of silicon. The surface of the insulating film thus formed is polished by a chemical mechanical polishing (CMP) method or a mechanical polishing (MP) method so as to form an element isolating insulating film 42.

An oxide film 51 for a dummy gate having a thickness of about 3 to 10 nm is formed by thermal oxidation on an element region sandwiched between adjacent element isolating insulating film and formed a dummy gate 52 in a thickness of 200 to 300 nm on the oxide film 51. The dummy gate 52 can be formed of an amorphous silicon film or a laminate structure prepared by laminating a silicon nitride film on a polysilicon film. Alternatively, it is also possible to form the dummy gate 52 by using a polymer containing carbon in an amount larger than that of hydrogen. In the case of using the polymer, a polymer film is formed on the oxide film 51, followed by applying a light exposure by using a photoresist or an EB resist mask and subsequently applying a RIE treatment by using an oxygen plasma. Depending on the case, it is possible to form, for example, an SOG film on the polymer film so as to enlarge the etching selectivity ratio in processing the polymer film.

The thickness of the oxide film 51 on the source and drain regions is larger than that of the oxide film 51 immediately below the dummy gate 52. This is caused by selective oxidation during post oxidation after gate electrode patterning. The selective oxidation can be successfully carried out by controlling oxidation temperature and $H_2/H_2O$ partial pressure ratio.

In the next step, ions of As, Sb, In, B or P are implanted into surface regions of the silicon semiconductor substrate 41 by using the dummy gate pattern 52 as a mask so as to form extension portions 53 of the source-drain regions in the silicon semiconductor substrate 41. The extension portions 53 can be formed by employing a plasma doping method or a gaseous phase diffusion method. Further, a heat treatment is applied by employing, for example, an RTA (Rapid Thermal Annealing) capable of a temperature elevation at a rate of 100° C./sec or more so as to achieve an electrical activation.

Where it is necessary to lower the resistivity of the source-drain regions, it is possible to form a metal silicide film such as a film of $CoSi_2$ or $TiSi_2$ in the source-drain regions by using the dummy gate 52 as a mask. Where the depth of the diffusion layer 53 is not more than 100 nm, it is desirable for the layer corroded by the silicide to be positioned at least 50 nm apart from the pn junction by, for example, forming a silicon layer, a Si—Ge layer or a Si—Ge—C layer on the source-drain regions by the technique of epitaxial growth.

Figure 5B:
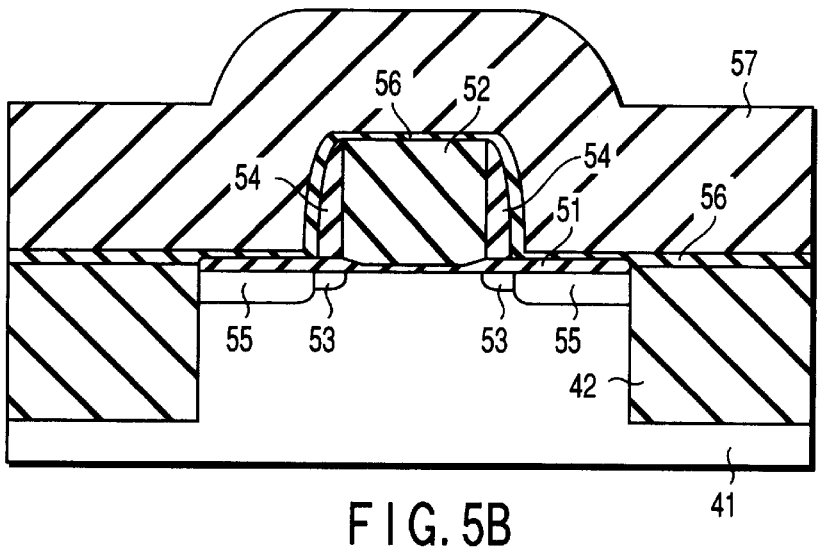

In the next step, the structure as shown in FIG. 5B is prepared. For preparing the particular structure, a side insulating film 54 consisting of a silicon nitride film or a silicon oxynitride film is formed in a thickness of 5 to 30 nm on the side wall of the dummy gate 52. It is desirable for an oxide film (not shown) having a thickness not larger than 10 nm to be interposed between the side wall insulating film 54 and the dummy gate 52 so as to prevent the side wall insulating film from receding in a lateral direction in the step of removing the dummy gate.

Then, deep portions 55 of the source-drain regions are formed in the silicon semiconductor substrate 41 by employing the method of an ion implantation, a plasma doping, or a gaseous phase diffusion. Further, a heat treatment is applied by employing an RTA (Rapid Thermal Annealing) capable of a temperature elevation at a rate of at least 100° C./sec for achieving an electrical activation.

In order to increase the activated impurity concentration in the deep portions 55 of the source-drain regions thus formed, it is possible to apply heating at 900° C. for 1 second or less by using an electron beam. Alternatively, it is possible to increase the activated impurity concentration by applying the heat treatment using a laser beam having a wavelength of the ultraviolet light region, a mercury lamp or a xenon lamp under the same conditions.

Figure 5C:
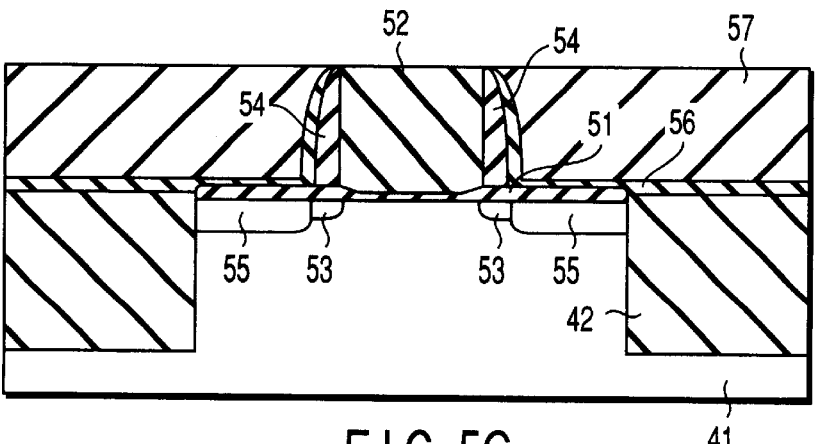

After formation of the source-drain diffusion layers, a first interlayer insulating film 56 and a second interlayer insulating film 57 are formed. The first interlayer insulating film 56 and the second interlayer insulating film 57 can be formed by depositing a silicon nitride film and a silicon oxide film, respectively, by a CVD method. Further, the first and second interlayer insulating films 56 and 57 are flattened by CMP so as to expose the surface of the dummy gate 52, as shown in FIG. 5C.

Figure 6A:
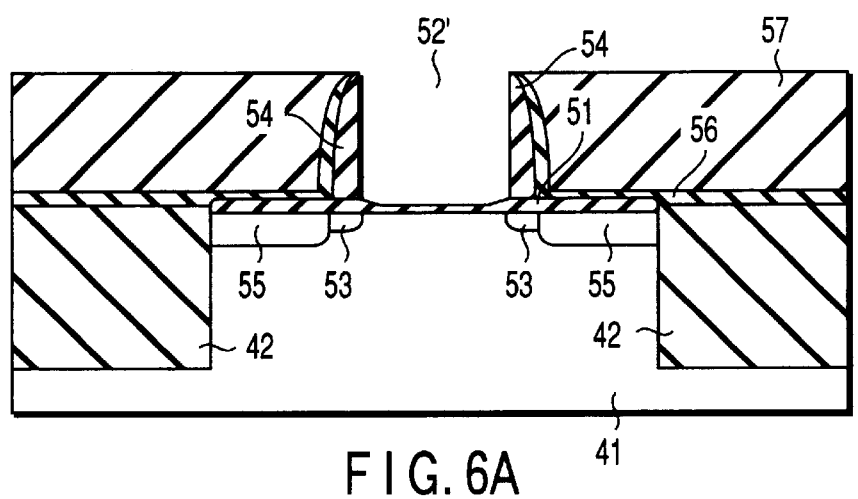
FIGS. 6A to 6C are cross sectional views collectively showing as another example of a method of manufacturing a semiconductor device of the present invention.

In the next step, the dummy gate 52 is removed by using an oxygen plasma or an active oxygen, as shown in FIG. 6A. Finally, the thin oxide film 51 is removed by etching so as not to form a crystal defect in the underlying silicon semiconductor substrate 41, thereby forming an opening 52'.

Figure 6B:
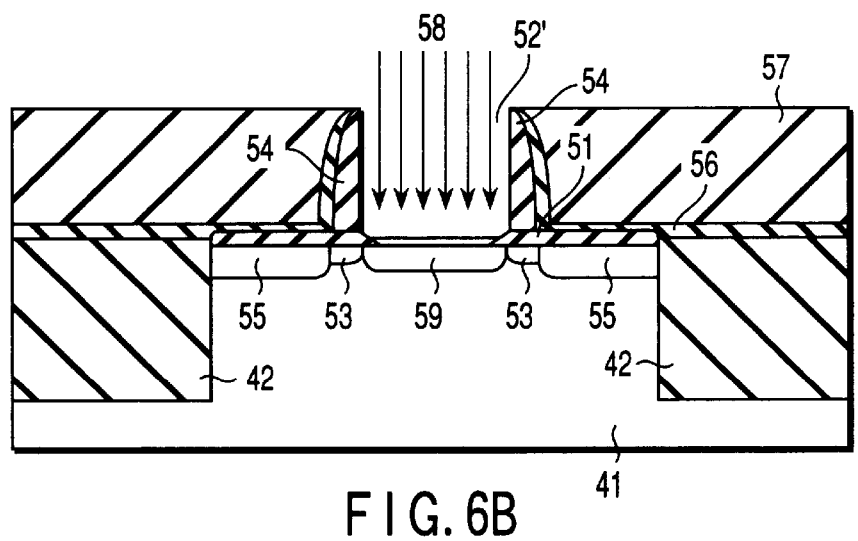
Figure 6C:
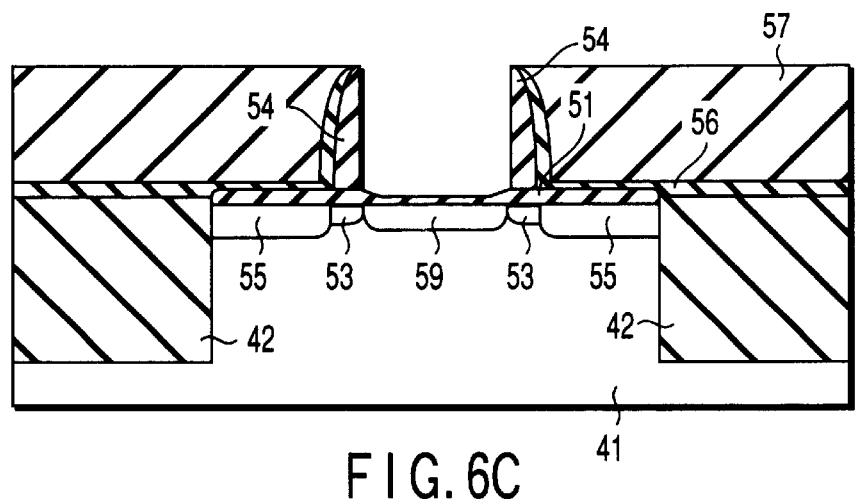

Then, a channel impurity 58 is introduced into the opening 52' by an ion implantation so as to form a doping layer 59, as shown in FIG. 6B. The doping layer 59 can be formed by, for example, implanting ions of As, Sb, In, B or Ge under an accelerating energy of 5 to 50 keV and at a dose of $1\times10^{10}$ to $1\times10^{14} cm^{-2}$. In this case, it is possible to suppress the agglomeration of the atomic void if the ion implantation is carried out at low temperatures while cooling the semiconductor substrate. It follows that it possible to restore completely the crystal defect by the heat treatment. To be more specific, it is desirable to carry out the ion implantation while cooling the semiconductor substrate to a temperature not higher than $-60°$ C., preferably not higher than $-100°$ C.

In the next step, the insulating film such as an oxide film on the channel is removed with a diluted hydrofluoric acid, a diluted ammonium fluoride or a mixed solution thereof.

Figure 7A:
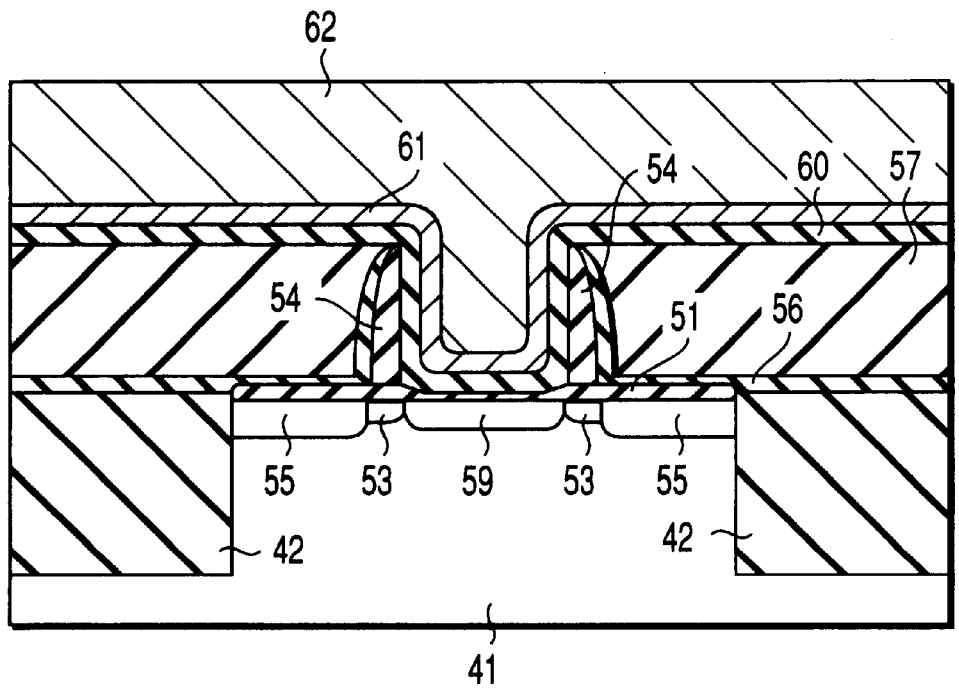
FIGS. 7A and 7B are cross sectional views collectively showing as still another example of a method of manufacturing a semiconductor device of the present invention.

After removal of the insulating film noted above, an oxide film having a thickness not larger than 1 nm is formed on the surface of the semiconductor substrate in the opening by using an oxygen radical or ozone. Further, an insulating film 60 having a relative dielectric constant larger than that of a silicon oxide film, a film 61 having a metallic conductivity, and a metal film 62 are formed successively, as shown in FIG. 7A. It is possible to use, for example, $Ta_2O_5$, $TiO_2$, $HfO_2$, $ZrO_2$, $CeO_2$, or $Y_2O_3$ for forming the insulating film 60 having a relative dielectric constant larger than that of a silicon oxide film. It is also possible to form the insulating film 60 having such a large relative dielectric constant by depositing a SiOXNy film in a thickness of 1 to 2 nm on the substrate surface. Alternatively, it is possible to form the insulating film 60 by nitriding the surface of an oxide film by using a nitrogen radical under a temperature not higher than $500°$ C.

The film 61 having a metallic conductivity can be formed by depositing, for example, a metal nitride serving to determine the work function of the gate in a thickness not larger than 10 nm. The film 61 having a metallic conductivity acts as a barrier metal film.

A polycrystalline metal material has properties that the work function is changed depending on the crystal face. Therefore, it is desirable to use a polycrystalline metal consisting of fine crystal grains of 30 nm or less or an amorphous conductive material for forming the barrier metal film.

The material determining the work function includes, for example, metal nitrides such as tantalum nitride, niobium nitride, zirconium nitride, hafnium nitride; metal carbide; metal boride; metal-silicon nitride; metal-silicon carbide; and metal carbon nitride. Titanium nitride has a work function of about 4.6 eV where the ratio of titanium to nitrogen is 1:1. It is possible to set the work function of titanium nitride at a value not higher than 4.5 eV by controlling the crystal face direction at a face direction having a low work function. Alternatively, where carbon is added to TiN to make TiN amorphous, the work function can be set at a value not higher than 4.5 eV by controlling the composition.

Preferably, in order to improve the thermal stability of these materials and the gate insulating film, it is effective to add oxygen in such an amount that the conductivity is not lowered by 50% or more. Also, these electrode materials are excellent in the thermal stability at the interface with a tantalum oxide film, a titanium oxide film, a zirconium oxide film, a hafnium oxide film, or a cesium oxide film.

Then, the metal film 62 is formed by depositing a first metal. As described previously, the first metal that has a low resistivity is selected from the group consisting of W, Mo, Ru, Ag and Cu.

Figure 7B:
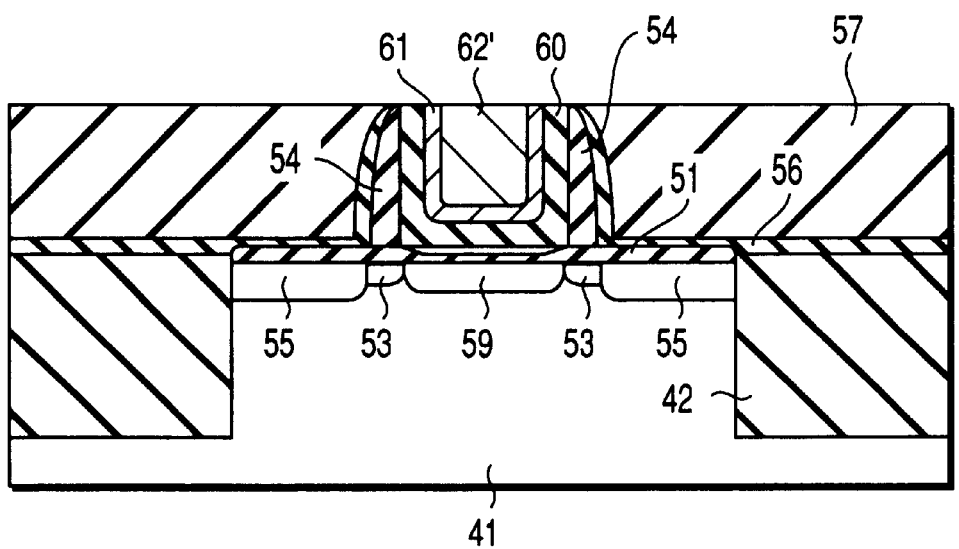

Further, the insulating film 60, the film 61 having a metallic conductivity, and the metal film 62 are etched while flattening these films by CMP or MP so as to finish forming a gate electrode 62' as shown in FIG. 7B.

Then, a metal oxide film (not shown) containing a second metal is formed on the surface of the gate electrode 62' by the method employed in any of the first to third embodiments described previously. As described previously, the second metal can be selected from the group consisting of Al, Ti, Zr, Hf, Nb, Ta, Ba, Sr, Y and La series elements. A metal oxide layer containing the second metal exhibits an etching rate in the contact RIE, which is markedly lower than that for $SiO_2$.

A silicon oxide film or an interlayer insulating film containing a silicon oxide film as a main component was deposited on the structure thus prepared, followed by forming a contact hole in the silicon oxide film or the interlayer insulating film. In forming the contact hole, it has been confirmed that the surface of the gate electrode 62' was not exposed to the outside so as to maintain an electrical insulation between the source-drain regions and the gate.

As described above in detail, the present invention provides a semiconductor device comprising a gate electrode having a high resistance to heat and having a short distance between the gate of a metal gate transistor and the source-drain contact so as to achieve a high degree of integration. The present invention also provide a method of manufacturing a semiconductor device comprising a gate electrode having a high resistance to heat and having a short distance between the gate of a metal gate transistor and the source-drain contact so as to achieve a high degree of integration by a simplified process without increasing RPT.

The present invention can be applied highly effectively to an LSI having a LOGIC and DRAM mounted together and, thus, has a very high industrial value.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a semiconductor substrate;

an insulating film formed on said semiconductor substrate and a gate electrode formed on said insulating film;

source-drain regions formed in said semiconductor substrate;

a metal oxide layer formed selectively on said gate electrode; and an interlayer insulating film formed of a silicon oxide film;

wherein said gate electrode is formed of a first metal, and said metal oxide layer contains a second metal having a reduction amount in a Gibbs standard free energy in forming an oxide larger than that of said first metal, and wherein said second metal has a reduction amount in a Gibbs standard free energy in forming an oxide that is larger than that of the material forming said interlayer insulating film.

2. The semiconductor device according to claim 1, wherein said first metal consists of at least one element selected from the group consisting of W, Mo, Ru, Ag and Cu.

3. The semiconductor device according to claim 1, wherein said second metal consists of at least one element selected from the group consisting of Al, Ti, Zr, Hf, Nb, Ta, Ba, Sr, Y and La series elements.

4. The semiconductor device according to claim 1, wherein said metal oxide layer has a thickness of 1 to 50 nm.

5. The semiconductor device according to claim 1, further comprising a layer of a third metal or a compound of said third metal formed on the bottom surface of said gate electrode, said third metal not being alloyed or not forming a compound with said first metal and the crystal grain diameter of said third metal being smaller than that of said first metal.

6. The semiconductor device according to claim 1, further comprising a layer of a third metal or a compound of said third metal formed on the bottom surface and side surface of said gate electrode, said third metal not being alloyed or not forming a compound with said first metal and the crystal grain diameter of said third metal being smaller than that of said first metal.

7. The semiconductor device according to claim 2, wherein said second metal consists of at least one element selected from the group consisting of Al, Ti, Zr, Hf, Nb, Ta, Ba, Sr, Y and La series elements.

8. The semiconductor device according to claim 2, wherein said metal oxide layer has a thickness of 1 to 50 nm.

9. The semiconductor device according to claim 3, wherein said metal oxide layer has a thickness of 1 to 50 nm.

10. A semiconductor device, comprising:

a semiconductor substrate;

an insulating film formed on said semiconductor substrate and a gate electrode formed on said insulating film;

source-drain regions formed in said semiconductor substrate;

a metal oxide layer formed selectively on said gate electrode; and an interlayer insulating film including a silicon oxide film;

wherein said gate electrode is formed of a first metal, and said metal oxide layer contains a second metal having a reduction amount in a Gibbs standard free energy in forming an oxide larger than that of said first metal, and wherein said second metal has a reduction amount in a Gibbs standard free energy in forming an oxide that is larger than that of the material forming said interlayer insulating film.

11. The semiconductor device according to claim 10, wherein said first metal consists of at least one element selected from the group consisting of W, Mo, Ru, Ag and Cu.

12. The semiconductor device according to claim 10, wherein said second metal consists of at least one element selected from the group consisting of Al, Ti, Zr, Hf, Nb, Ta, Ba, Sr, Y and La series elements.

13. The semiconductor device according to claim 10, wherein said metal oxide layer has a thickness of 1 to 50 nm.

14. The semiconductor device according to claim 10, further comprising a layer of a third metal or a compound of said third metal formed on the bottom surface of said gate electrode, said third metal not being alloyed or not forming a compound with said first metal and the crystal grain diameter of said third metal being smaller than that of said first metal.

15. The semiconductor device according to claim 10, further comprising a layer of a third metal or a compound of said third metal formed on the bottom surface and side surface of said gate electrode, said third metal not being alloyed or not forming a compound with said first metal and the crystal grain diameter of said third metal being smaller than that of said first metal.

16. The semiconductor device according to claim 11, wherein said second metal consists of at least one element selected from the group consisting of Al, Ti, Zr, Hf, Nb, Ta, Ba, Sr, Y and La series elements.

17. The semiconductor device according to claim 11, wherein said metal oxide layer has a thickness of 1 to 50 nm.

18. The semiconductor device according to claim 12, wherein said metal oxide layer has a thickness of 1 to 50 nm.

* * * * *